United States Patent [19]

Fujishima et al.

[11] Patent Number: 5,226,147
[45] Date of Patent: Jul. 6, 1993

[54] SEMICONDUCTOR MEMORY DEVICE FOR SIMPLE CACHE SYSTEM

[75] Inventors: Kazuyasu Fujishima; Yoshio Matsuda; Mikio Asakura, all of Hyogo, Japan

[73] Assignee: Mitsubishi Denki Kabushiki Kaisha, Tokyo, Japan

[21] Appl. No.: 564,657

[22] Filed: Aug. 9, 1990

Related U.S. Application Data

[63] Continuation of Ser. No. 266,601, Nov. 3, 1988, abandoned.

[30] Foreign Application Priority Data

Nov. 6, 1987 [JP] Japan ................................. 62-281619
Dec. 17, 1987 [JP] Japan ................................. 62-322126

[51] Int. Cl.⁵ ............... G06F 12/00; G06F 12/08; G06F 13/00; G11C 7/00
[52] U.S. Cl. ............... 395/425; 365/230.03; 365/63; 365/49; 364/DIG. 1; 364/243.41
[58] Field of Search ............ 365/49, 230.03, 63; 364/200 MS File, 900 MS File, 243.4, 243.41, 964, 964.2; 395/425

[56] References Cited

U.S. PATENT DOCUMENTS

| | | | |
|---|---|---|---|
| 4,168,541 | 9/1979 | DeKarske | 365/49 |
| 4,219,883 | 8/1980 | Kobayashi et al. | 365/49 X |
| 4,577,293 | 3/1986 | Matick et al. | 365/49 |
| 4,656,626 | 4/1987 | Yudichak | 365/49 |
| 4,669,043 | 5/1987 | Kaplinsky | 364/200 |
| 4,731,758 | 3/1988 | Lam et al. | 365/189.05 |
| 4,754,433 | 6/1988 | Chin et al. | 365/189.02 |
| 4,845,677 | 7/1989 | Chappell et al. | 365/189.02 |
| 4,872,138 | 10/1989 | Ciacci | 365/49 |
| 4,926,385 | 5/1990 | Fujishima et al. | 365/230.03 |
| 4,953,073 | 8/1990 | Moussouris et al. | 364/200 |
| 5,014,240 | 5/1991 | Suzuki | 365/49 |
| 5,111,386 | 5/1992 | Fujishima et al. | 395/425 |

OTHER PUBLICATIONS

Asakura et al., "An Experimental 1Mb Cache DRAM with ECC", *1989 Symposium on VLSI Circuits* (May 25-27, 1989), pp. 43-44.
Asakura et al., "An Experimental 1-Mbit Cache DRAM with ECC", *IEEE Journal of Solid-State Circuits*, vol. 25, No. 1 (Feb. 1990), pp. 5-10.
Hidaka et al., "The Cache DRAM Architecture: A DRAM with an On-Chip Cache Memory", *IEEE Micro* (Apr. 1990) pp. 15-24.

*Primary Examiner*—Alyssa H. Bowler
*Attorney, Agent, or Firm*—Lowe, Price, LeBlanc & Becker

[57] ABSTRACT

A semiconductor memory device comprises a DRAM memory cell array comprising a plurality of dynamic type memory cells arranged in a plurality of rows and columns, and an SRAM memory cell array comprising static type memory cells arranged in a plurality of rows and columns. The DRAM memory cell array is divided into a plurality of blocks each comprising a plurality of columns. The SRAM memory cell array is divided into a plurality of blocks each comprising a plurality of columns, corresponding to the plurality of blocks in the DRAM memory cell array. The SRAM memory cell array is used as a cache memory. At the time of cache hit, data is accessed to the SRAM memory cell array. At the time of cache miss, data is accessed to the DRAM memory cell array. On this occasion, data corresponding to one row in each of the blocks in the DRAM memory cell array is transferred to one row in the corresponding block in the SRAM memory cell array.

19 Claims, 12 Drawing Sheets

SEMICONDUCTOR MEMORY DEVICE FOR SIMPLE CACHE SYSTEM

This application is a continuation; application of application Ser. No. 07/266,601, filed Nov. 3, 1988, now abandoned.

Related, copending application of particular interest to the instant application is U.S. Ser. No. 07/266,060 entitled "Cache Contained Type Semiconductor Memory Device and Operating Method Therefor" filed Nov. 2, 1988 and assigned to the same assignee of the instant application. The application issued as U.S. Pat. No. 5,111,386.

BACKGROUND OF THE INVENTION

1. Field of the Invention

The present invention relates generally to semiconductor memory devices for a simple cache system, and more particularly, to semiconductor memory devices having a cache memory integrated on a chip on which the semiconductor memory device is formed.

2. Description of the Prior Art

Conventionally, in order to improve cost performance of a computer system, a small capacity and high-speed memory has been frequently provided as a high-speed buffer between a main memory structured by a low-speed but large capacity and low-cost dynamic random access memory (DRAM) and a central processing unit (CPU). The high-speed buffer is referred to as a cache memory. A block of data which the CPU may request is copied from the main memory and stored in the high-speed buffer. The state in which data stored in an address, in the DRAM, which the CPU attempts to access exist in the cache memory is referred to as "hit". In this case, the CPU makes access to the high-speed cache memory, and acquires the requested data from the cache memory. On the other hand, the state in which data stored in an address which the CPU attempts to access does not exist in the cache memory is referred to as "cache miss". In this case, the CPU makes access to the low-speed main memory, acquires the requested data from the main memory and at the same time, transfers to the cache memory a data block to which the data belongs.

However, such a cache memory system could not be employed in a small-sized computer system attaching important to the cost because it requires a high-cost and a high-speed memory. Conventionally, a simple cache system has been configured utilizing a high-speed access function of a general-purpose DRAM, such as a page mode and a static column mode.

FIG. 1 is a block diagram showing a basic structure of a conventional DRAM device having a function of a page mode or a static column mode.

In FIG. 1, a memory cell array 1 has a plurality of word lines and a plurality of bit line pairs arranged intersecting with each other, memory cells being provided at intersections thereof, respectively. In FIG. 1, there are typically shown only a single word line WL, a single bit line pair BL and $\overline{BL}$ and a single memory cell MC provided at an intersection of the word line WL and the bit line BL. The word lines in the memory cell array 1 are connected to a row decoder portion 3 through a word driver 2. In addition, the bit line pairs in the memory cell array 1 are connected to a column decoder portion 6 through a sense amplifier portion 4 and an I/O switching portion 5. A row address buffer 7 is connected to the row decoder portion 3, and a column address buffer 8 is connected to the column decoder portion 6. A multiplex address signal MPXA obtained by multiplexing a row address signal RA and a column address signal CA is applied to the row address buffer 7 and the column address buffer 8. An output buffer 9 and an input buffer 10 are connected to the I/O switching portion 5.

FIGS. 2A, 2B and 2C are waveform diagrams showing operations in an ordinary read cycle, a page mode cycle and a static column mode cycle of the DRAM, respectively.

In the ordinary read cycle shown in FIG. 2A, the row address buffer 7 first acquires the multiplex address signal MPXA at the falling edge of a row address strobe signal $\overline{RAS}$ and applies the same to the row decoder portion 3 as a row address signal RA. The row decoder portion 3 is responsive to the row address signal RA for selecting one of the plurality of word lines. The selected word line is activated by the word driver 2. Consequently, information stored in the plurality of memory cells connected to the selected word lines are read out onto the corresponding bit lines, respectively. The information are detected and amplified by the sense amplifier portion 4. At this time point, information stored in the memory cells corresponding to one row are latched in the sense amplifier portion 4. Then, the column address buffer 8 acquires the multiplex address signal MPXA at the falling edge of a column address strobe signal $\overline{CAS}$ and applies the same to the column decoder portion 6 as a column address signal CA. The column decoder portion 6 is responsive to the column address signal CA for selecting one of information corresponding to one row latched in the sense amplifier portion 4. This selected information is extracted to the exterior through the I/O switching portion 5 and the output buffer 9 as output data $D_{OUT}$. An access time ($\overline{RAS}$ access time) $t_{RAC}$ in this case is the time period elapsed from the falling edge of the row address strobe signal $\overline{RAS}$ until the output data $D_{OUT}$ becomes valid. In addition, a cycle time $t_c$ in this case is the sum of the time period during which the device is in an active state and an $\overline{RAS}$ precharge time $t_{RP}$. As a standard value, $t_c$ is approximately 200 ns when $t_{RAC}$ is 100 ns.

In the page mode cycle and the static column mode cycle shown in FIGS. 2B and 2C, memory cells on the same row address are accessed by changing the column address signal CA. In the page mode cycle, the column address signal CA is latched at the falling edge of the column address strobe signal $\overline{CAS}$. Thus, the access time is a time period $t_{CAC}$ (CAS access time) elapsed from the falling edge of the column address strobe signal $\overline{CAS}$ until the output data $D_{OUT}$ becomes valid, which becomes a time period of approximately one-half of the access time $t_{RAC}$ in the ordinary cycle, i.e., approximately 50 ns, where $t_{CP}$ denotes a precharge time of the column address strobe signal $\overline{CAS}$, and $t_{PC}$ denotes a cycle time.

In the static column mode, access is made in response to only the change in the column address signal CA, as in a static RAM (SRAM). Thus, the access time is a time period $t_{AA}$ (address access time) from the time when the column address signal CA is changed to the time when the output data $D_{OUT}$ becomes valid, which becomes approximately one-half of the access time $t_{RAC}$ in the ordinary cycle similarly to $t_{CAC}$, i.e., generally about 50 ns.

More specifically, in the page mode cycle, when the falling edge of the column address strobe signal $\overline{CAS}$ is inputted to the column address buffer 8, the column address signal CA is sent to the column decoder. Therefore, any of the data corresponding to one row latched in the sense amplifier portion 4 is made valid, so that the output data $D_{OUT}$ is obtained through the output buffer 9. Also in the static column mode cycle, the same operation as that in the page mode cycle is performed except a reading operation is initiated in response to the change in address signal.

FIG. 3 is a block diagram showing a structure of a simple cache system utilizing the page mode or the static column mode of the DRAM device shown in FIG. 1. In addition, FIG. 4 is a waveform diagram showing an operation of the simple cache system shown in FIG. 3.

In FIG. 3, a main memory 20 comprises 1M byte which comprises 8 DRAM devices 21 each having $1M \times 1$ organization. In this case, the row address signal RA and the column address signal CA having a total of 20 bits ($2^{20} = 1048576 = 1M$) are required. An address multiplexer 22, which applies 10-bit row address signal RA and the 10-bit column address signal CA to the main memory 20 two times, has 20 address lines $A_0$ to $A_{19}$ receiving a 20-bit address signal and 10 address lines $A_0$ to $A_9$ applying a 10-bit address signal as multiplexed (multiplex address signal MPXA) to the DRAM devices 21.

It is assumed here that data corresponding to one row selected by a row address RAL has been already latched in the sense amplifier portion 4 in each of the DRAM devices 21. An address generator 23 generates a 20-bit address signal corresponding to data which the CPU requests. The latch TAG) 25 holds the row address RAL corresponding to data selected in the preceding cycle. A comparator 26 compares the 10-bit row address RA out of the 20-bit address signal with the row address RAL held in the TAG 25. When both coincide with each other, which means that the same row as that accessed in the preceding cycle is accessed ("hit"), the comparator 26 generates an "H" level cache hit signal CH. A state machine 27 is responsive to the cache hit signal CH for performing page mode control in which a column address strobe signal $\overline{CAS}$ is toggled (raised and then, lowered) with a row address strobe signal $\overline{RAS}$ being kept at a low level. In response thereto, the address multiplexer 22 applies the column address signal CA to the DRAM devices 21 (see FIG. 4). Thus, data corresponding to the column address signal CA is extracted from a group of data latched in the sense amplifier portion in each of the DRAM devices 21. In the case of such "hit", output data is obtained from the DRAM devices 21 at high speed in an access time $t_{CAC}$.

On the other hand, when the row address signal RA generated from the address generator 23 and the row address RAL held in the TAG 25 do not coincide with each other, which means that a different row from the row accessed in the preceding cycle is accessed ("cache miss"), the comparator 26 does not generate the "H" level cache hit signal CH. In this case, the state machine 27 performs ordinary $\overline{RAS}$ and $\overline{CAS}$ control in the ordinary read cycle, and the address multiplexer 22 sequentially applies the row address signal RA and the column address signal CA to the DRAM devices 21 (see FIG. 4). In the case of such "cache miss", the ordinary read cycle beginning with precharging of the row address strobe signal $\overline{RAS}$ occurs, so that output data is obtained at low speed in the access time $t_{RAC}$. Therefore, the state machine 27 generates a wait signal Wait, to bring a CPU 24 into a Wait state. In the case of "cache miss", a new row address signal RA is held in the TAG 25.

As described in the foregoing, in the simple cache system shown in FIG. 3, data corresponding to one row of the memory cell array in each of the DRAM devices (1024 bits in the case of a 1M bit device) is latched in a sense amplifier portion as one block. Therefore, the block size is unnecessarily large and the blocks (entries) held in the TAG 25 are insufficient in number. For example, in the system shown in FIG. 3, the number of entries becomes 1. Thus, only when access is continuously made to the same row address, cache hit occurs. Consequently, for example, when a program routine bridged over continuous two row addresses is repeatedly implemented, cache miss necessarily occurs, so that a cache hit rate is low.

Meanwhile, as another conventionally example, a simple cache system has been proposed, which is disclosed in U.S. Pat. No. 4,577,293. In this simple cache system, a register holding data corresponding to one row is provided outside a memory cell array. In the case of "hit", the data is directly extracted from this register, so that accessing is speeded up. However, in the simple cache system disclosed in the U.S. Patent, the external register holds data corresponding to one row in the memory cell array, so that the block size is unnecessarily large and the cache hit rate is low as in the conventional example shown in FIG. 1 and 3.

SUMMARY OF THE INVENTION

One object of the present invention is to provide a semiconductor memory device which can configure a high-speed simple cache system having a high cache hit rate.

Another object of the present invention is to provide a semiconductor memory device which can configure a simple cache system having an increased number of entries.

Still another object of the present invention is to provide a semiconductor memory device containing a cache memory in which an access time at the time of cache hit can be shortened.

Still another object of the present invention is to provide a semiconductor memory device containing a cache memory in which the number of entries of data can be increased without unnecessarily increasing the data block size.

A further object of the present invention is to provide an operating method for a semiconductor memory device which can configure a high-speed simple cache system having a high cache hit rate.

A still further object of the present invention is to provide an operating method for a semiconductor memory device containing a cache memory in which an access time at the time of cache hit can be shorten.

The semiconductor memory device according to the present invention is a semiconductor memory device containing a cache memory employed in a simple cache system including a generator for generating a cache hit/miss indicating signal, which comprises a first memory cell array, a second memory cell array, first access means, second access means, and data transfer means.

The first memory cell array comprises a plurality of memory cells arranged in a plurality of rows and columns. The second memory cell array comprises a plurality of static type memory cells arranged in a plurality of rows and a plurality of columns corresponding to the plurality of columns in the first memory cell array. The first access means is responsive to a cache miss indicating signal for accessing data to a memory cell selected by a first row address signal externally applied and a column address signal externally applied in the first memory cell array. The second access means is responsive to a cache hit indicating signal for accessing data to a static type memory cell selected by a second row address signal externally applied and the column address signal externally applied in the second memory cell array. The data transfer means transfers data between a row selected by the first row address signal externally applied in the first memory cell array and a row selected by the second row address signal externally applied in the second memory cell array.

In the semiconductor memory device according to the present invention, since the second memory cell array comprises a plurality of static type memory cells in a plurality of rows, data blocks on different rows in the first memory cell array can be held in the second memory cell array. Thus, the semiconductor memory device can configure a simple cache system in which the number of entries is increased so that a cache hit rate is improved.

In accordance with another aspect of the present invention, a semiconductor memory device for a simple cache system having a cache memory integrated on a chip on which the semiconductor memory device is formed comprises a first memory cell array, a second memory cell array, first access means, second access means, block selecting means, region selecting means, data transfer means and data selecting means.

The first memory cell array comprises a plurality of memory cells arranged in a plurality of rows and columns. The first memory cell array is divided into a plurality of blocks each comprising a plurality of columns. The second memory cell array comprises a plurality of static type memory cells arranged in a plurality of rows and columns. The second memory cell array is divided into a plurality of regions each comprising the same number of a plurality of rows as the plurality of columns included in each of the plurality of blocks in the first memory cell array. The first access means accesses data to a memory cell selected by a first row address signal externally applied and a column address signal externally applied in the first memory cell array. The second access means accesses data to a static type memory cell selected by a cache address signal externally applied in the plurality of regions in the second memory cell array.

The block selecting means is responsive to a block selecting signal externally applied for selecting any of the plurality of blocks in the first memory cell array. The region selecting means is responsive to a region selecting signal externally applied for selecting any of the plurality of regions in the second memory cell array. The data transfer means transfers data between the a block, in the first memory cell array, selected by the block selecting means and the region, in the second memory cell array, selected by the region selecting means. Data selecting means is responsive to the region selecting signal for selecting any of data to/from the plurality of static type memory cells accessed by the second access means in the plurality of regions.

In this semiconductor memory device containing a cache memory, data blocks on the plurality of rows in the first memory cell array can be held on the second memory cell array. In addition, a plurality of data blocks respectively on a plurality of different rows in the same block in the first memory cell array can be simultaneously held in different regions in the second memory cell array. Furthermore, the data blocks respectively on the plurality of different rows in the same block in the first memory cell array can be arranged on one row in the second memory cell array.

Thus, if the second memory cell array is utilized as a cache memory, the number of entries of data can be efficiently increased, so that the cache hit rate can be improved. Additionally, access can be made to the second memory cell array before determination of cache hit/cache miss. In this case, data are extracted from the plurality of regions in the second memory cell array. Thereafter, when it is determined that cache hit occurs, any of the data extracted from the plurality of regions is selected. When it is determined that cache miss occurs, the data extracted from the second memory cell array is ignored. Thus, an access time at the time of cache hit can be shorten. As a result, semiconductor memory device can configure a high-speed simple set associative cache system having a high cache hit rate.

DESCRIPTION OF THE PREFERRED EMBODIMENTS

Figure 1:
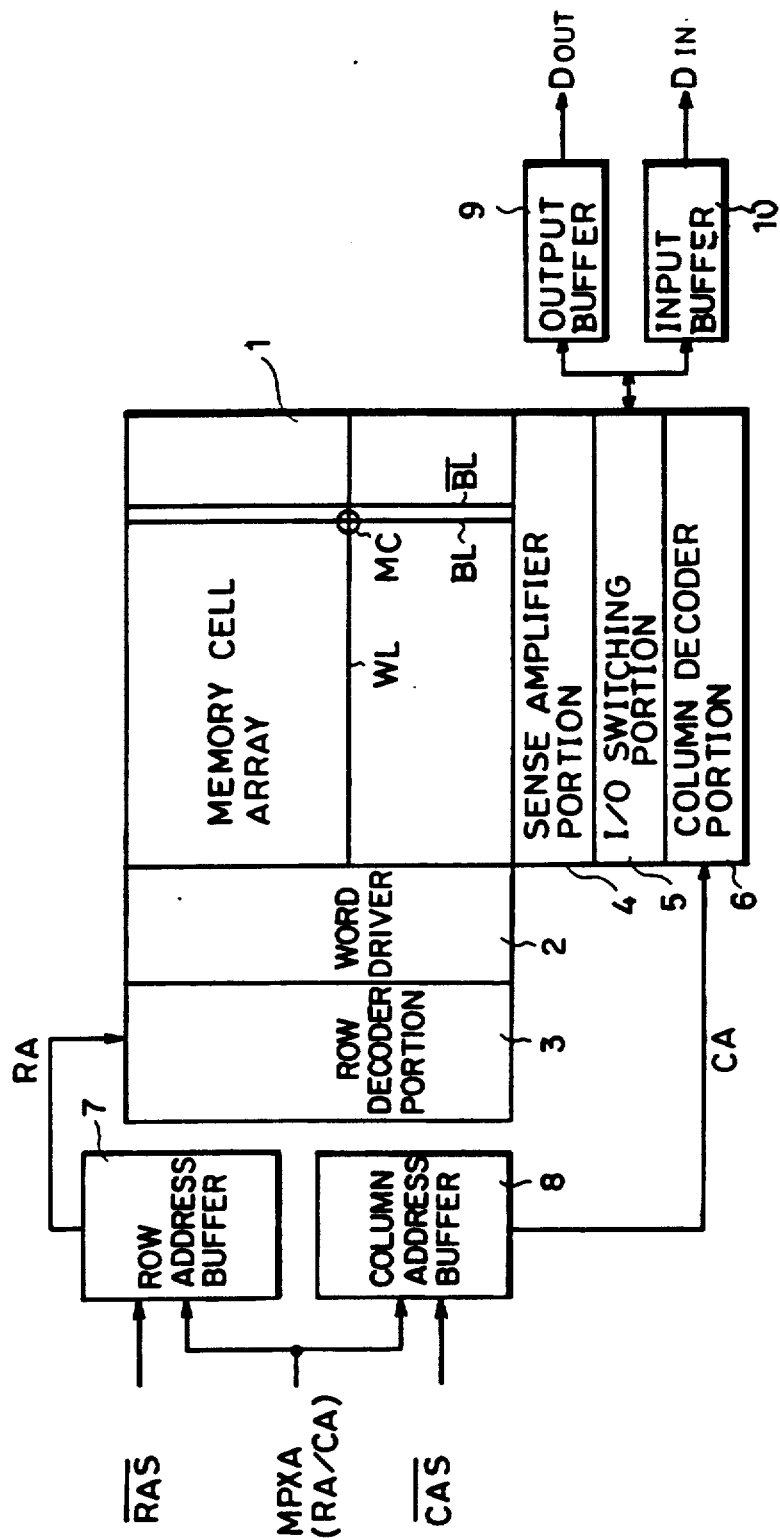
FIG. 1 is a block diagram showing a structure of a conventional DRAM device.
Figure 2A:
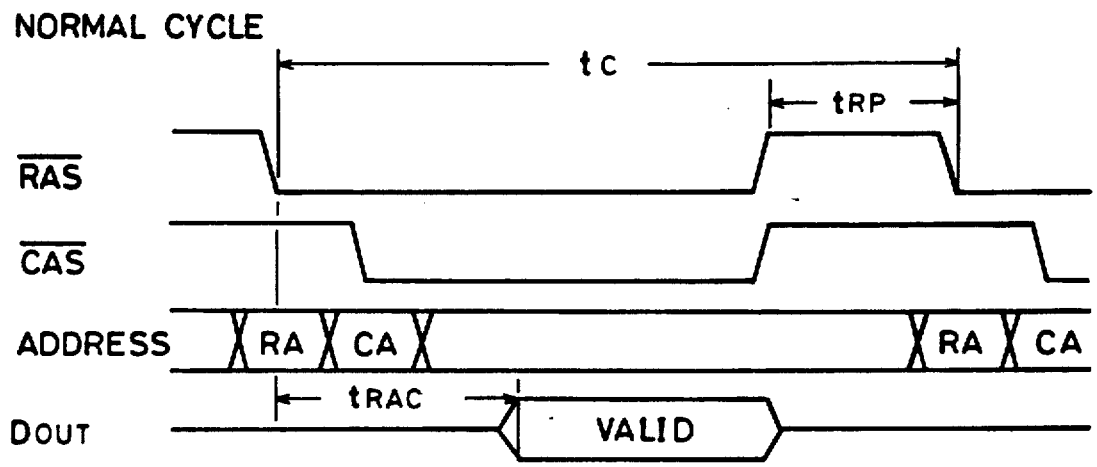
FIG. 2A is a waveform diagram showing an operation in an ordinary read cycle of the conventional DRAM device.
Figure 2B:
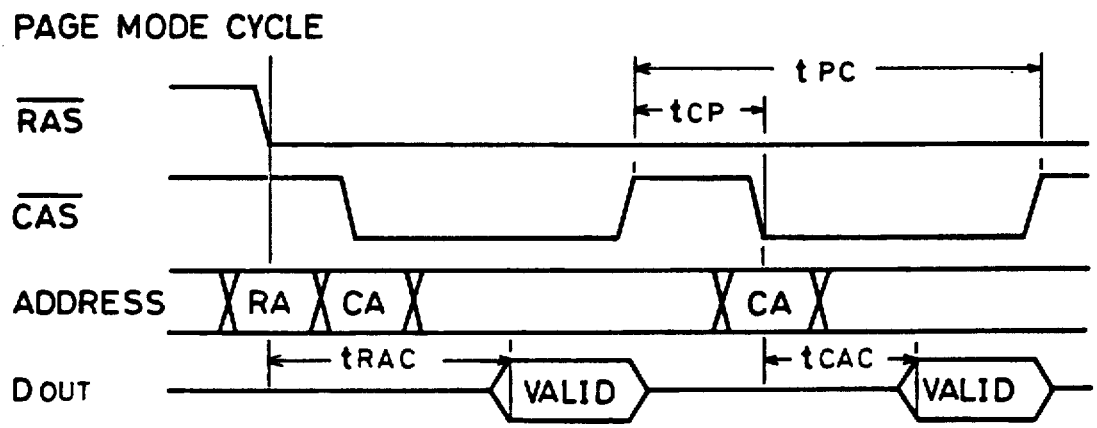
FIG. 2B is a waveform diagram showing an operation in a page mode cycle of the conventional DRAM device.
Figure 2C:
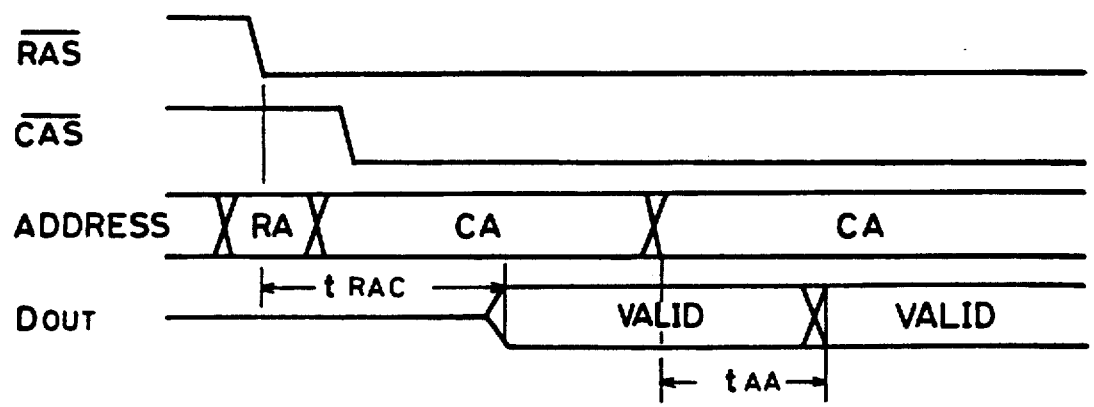
FIG. 2C is a waveform diagram showing an operation in a static column mode cycle of the conventional DRAM device.

Referring now to the drawings, embodiments of the present invention will be described in detail.

Figure 5:
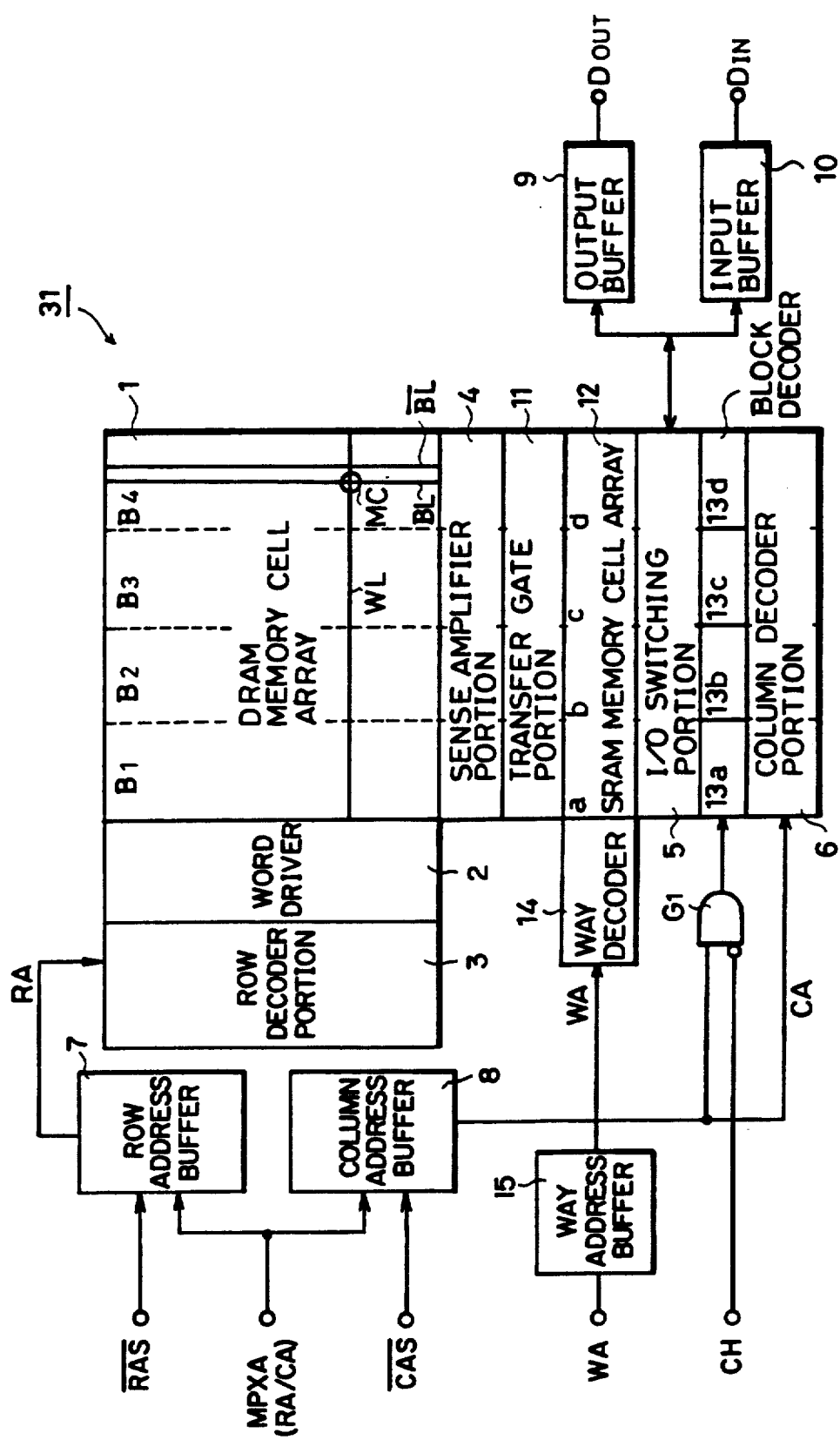
FIG. 5 is a block diagram showing a structure of a DRAM device containing a cache memory according to one embodiment of the present invention.

FIG. 5 is a block diagram showing a structure of a DRAM device containing a cache memory according to one embodiment of the present invention.

This DRAM device is the same as the conventional DRAM device shown in FIG. 1 except for the following. More specifically, a DRAM memory cell array 1 is divided into a plurality of blocks each comprising DRAM memory cells (dynamic type memory cells) in a plurality of rows on the address space. In FIG. 5, the DRAM memory cell array 1 is divided into four blocks B1 to B4. In addition, a transfer gate portion 11 and a static random access memory type memory cell array (referred to as SRAM memory cell array hereinafter) are provided between a sense amplifier portion 4 and an I/O switching portion 5. Furthermore, block decoders 13a to d and a way decoder 14 are provided. The SRAM memory cell array 12 is divided into four blocks a to d corresponding to the four blocks B1 to B4 in the DRAM memory cell array 1. Activation of each of the block decoders 13a to 13d is controlled by an AND gate $G_1$ to which more significant two bits of a column address signal CA from a column address buffer 8 and an inverted signal of a cache hit signal CH are inputted. More specifically, when the cache hit signal CH is at an "L" level, a block decoder corresponding to a block selected by more significant two bits of the column address signal CA is activated. On the other hand, when the cache hit signal CH is at an "H" level, no block decoder is activated. In addition, a way address signal WA is applied to the way decoder 14 through a way address buffer 15. The way decoder 14 is responsive to the way address signal WA for selecting and driving word lines in the SRAM memory cell array 12. Circuit blocks shown in FIG. 5 are all formed on the same semiconductor chip.

Figure 6:
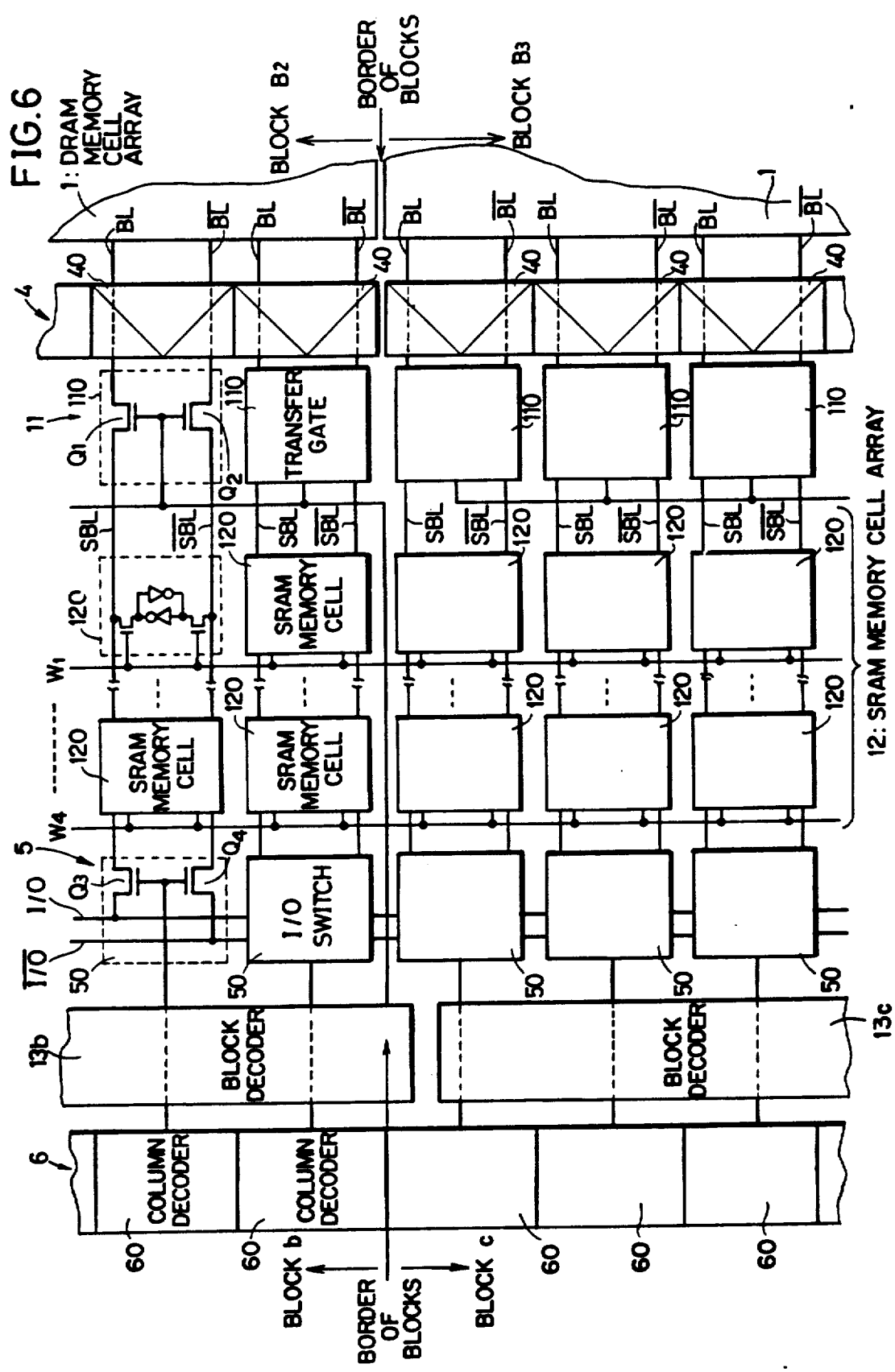
FIG. 6 is a block diagram showing specifically a structure of a part of the DRAM device shown in FIG. 5.

FIG. 6 is a diagram showing specifically a structure of a part of the DRAM device shown in FIG. 5.

In FIG. 6, a sense amplifier portion 4, a transfer gate portion 11, an I/O switching portion 5 and a column decoder portion 6 comprise a plurality of sense amplifiers 40, a plurality of transfer gates 110, a plurality of I/O switches 50 and a plurality of column decoders 60, respectively, corresponding to a plurality of bit line pairs BL and $\overline{BL}$ in the DRAM memory cell array 1. Each of the sense amplifiers 40 is connected between each of the bit line pairs BL and $\overline{BL}$. Each of the transfer gates 60 comprises N channel MOSFETs Q1 and Q2. Each of the I/O switches 50 comprises N channel MOSFETs Q3 and Q4. In the SRAM memory cell array 12, a plurality of bit line pairs SBL and $\overline{SBL}$ are arranged corresponding to the plurality of bit line pairs BL and $\overline{BL}$ in the DRAM memory cell array 1. Four word lines W1 to W4, for example, are arranged intersecting with the plurality of bit line pairs SBL and $\overline{SBL}$, static type memory cells (referred to as SRAM memory cells hereinafter) 120 being provided at intersections thereof.

Each of the bit line pairs BL and $\overline{BL}$ is connected to the corresponding bit line pair SBL and $\overline{SBL}$ in the SRAM memory cell array 12 through the MOSFETs Q1 and Q2 in the corresponding transfer gate 110. The bit line pairs SBL and $\overline{SBL}$ in the SRAM memory cell array 12 is connected to I/O buses I/O and $\overline{I/O}$ through the MOSFETs Q3 and Q4 in the corresponding I/O switch 50, respectively.

Additionally, block decoders 13a to 13d are arranged corresponding to the blocks B1 to B4 in the DRAM memory cell array 1. The block decoders 13a to 13d apply common transfer signals to gates of the MOSFETs and Q2 in the transfer gate 110 belonging to the corresponding blocks, respectively. In addition, each of the column decoders 60 applies a column selecting signal to gates of MOSFETs Q3 and Q4 in the corresponding I/O switch 50.

In this DRAM device, when any of the block decoders 13a to 13d applies a transfer signal to the transfer gates 110 belonging to the corresponding block in response to the cache hit signal CH, data on one row in the corresponding block in the DRAM memory cell array 1 is transferred to the corresponding block in the SRAM memory cell array 12. On the other hand, when any of the word lines $W_1$ to $W_4$ in the SRAM memory cell array 1 is selected and driven by the way decoder 14 (FIG. 5), data stored in the SRAM memory cells 120 connected to the word line are read out onto the corresponding bit line pairs SBL and $\overline{SBL}$. When a column selecting signal is applied from any of the column decoders 60 to the corresponding I/O switch 50, the data read out onto the corresponding bit line pair SBL and $\overline{SBL}$ is read out onto the I/O buses I/O and $\overline{I/O}$.

In this DRAM device, data corresponding to one row in a plurality of columns are considered as one data block. A plurality of data blocks each on different rows are held in the plurality of SRAM memory cells 120. In addition, data blocks respectively on different rows in the same block are simultaneously held on the SRAM memory cell array 12 (associativity). Thus, if the SRAM memory cell array 12 is utilized as a cache memory, the number of entries of data can be increased. As a result, a cache hit rate can be improved.

Furthermore, if the word lines $W_1$ to $W_4$ in the SRAM memory cell array 12 are kept in an inactive state, a structure can be configured in which no transfer to the cache memory is made at the time of writing and reading operations to and from the DRAM memory cell array 1, so that the degree of freedom is increased in the application to the cache memory system.

Figure 7:
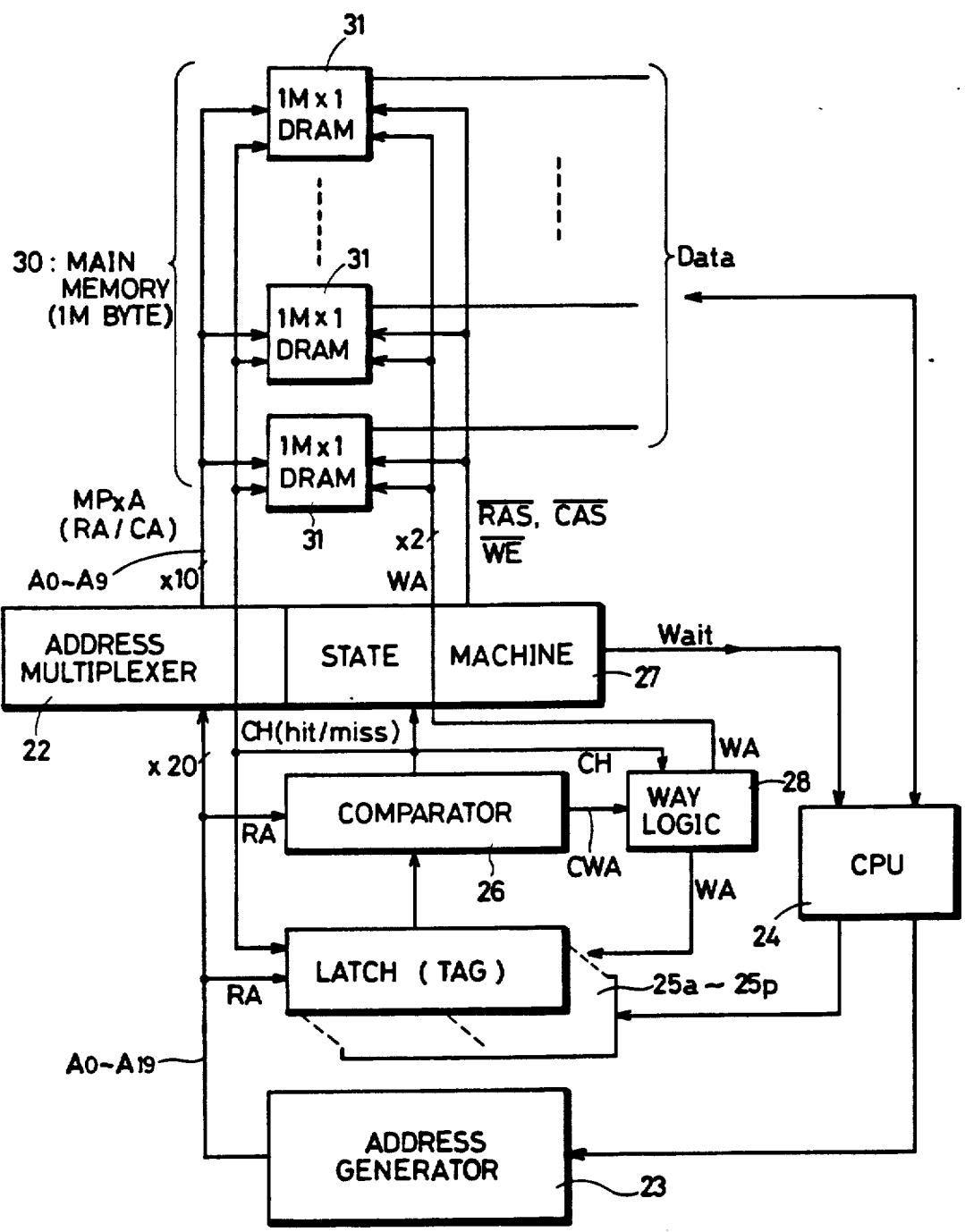
FIG. 7 is a block diagram showing a structure of a simple cache system utilizing the DRAM device shown in FIG. 5.

FIG. 7 is a block diagram showing a structure of a simple cache system utilizing the DRAM device shown in FIG. 5.

Figure 3:
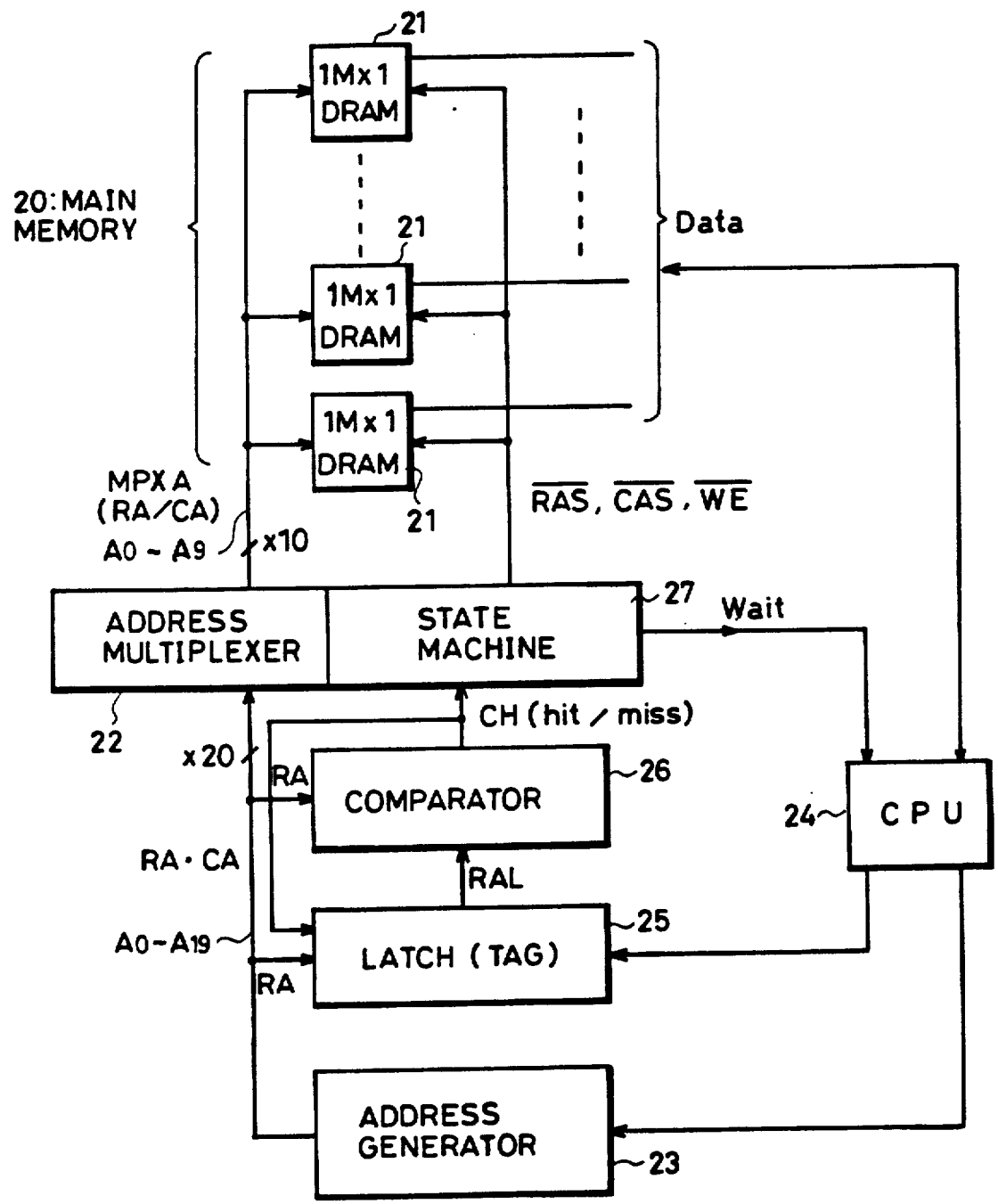
FIG. 3 is a block diagram showing a structure of a simple cache system utilizing the DRAM device shown in FIG. 1.
Figure 4:
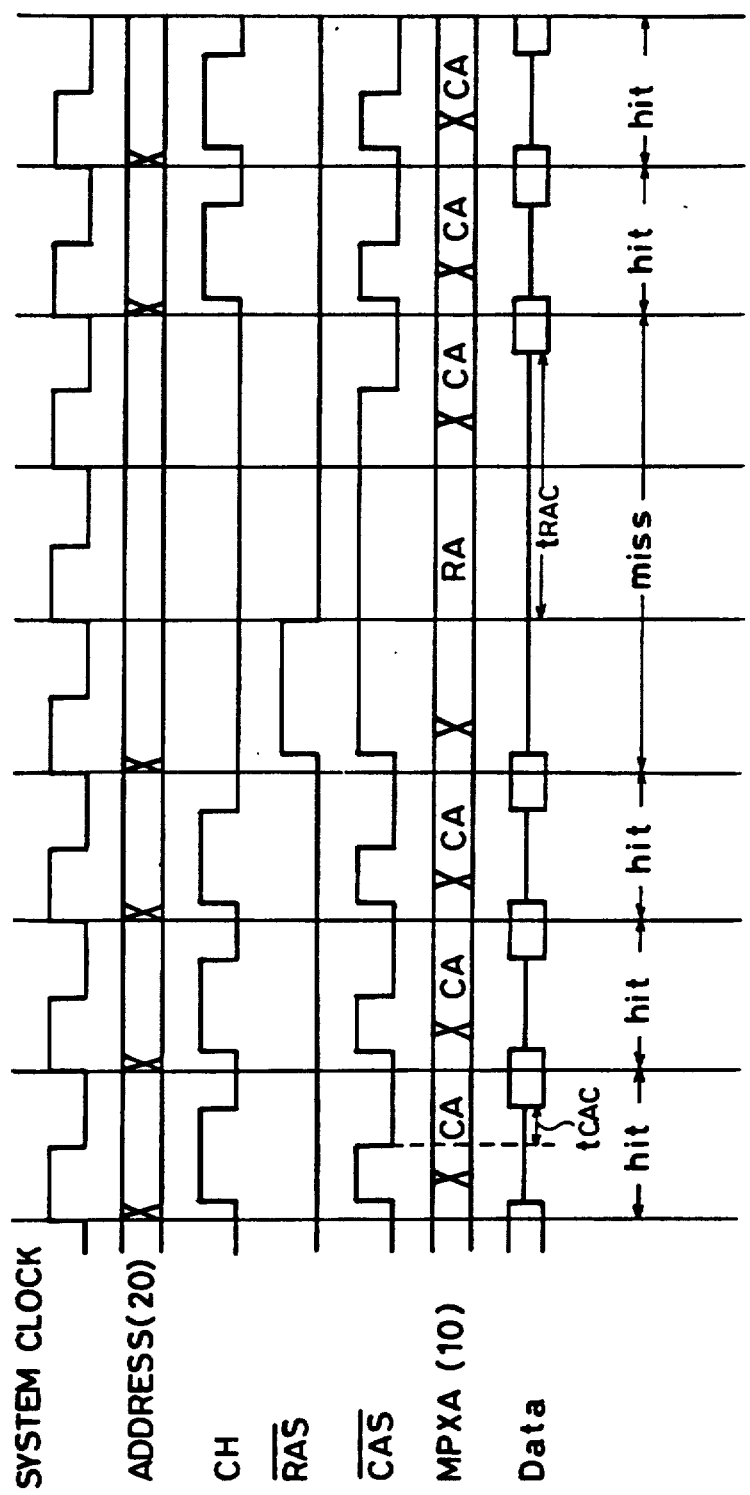
FIG. 4 is a waveform diagram showing an operation of a simple cache system shown in FIG. 3.

In FIG. 7, a main memory 30 comprises 1M byte which comprise 8 DRAM devices 31 each having 1M×1 organization. The cache system shown in FIG. 7 is the same as the cache system shown in FIG. 3 except for the following. More specifically, the number of TAGs 25 is increased corresponding to the number of divisions of blocks in each of the DRAM devices 31 and the number of word lines (the number of sets) in the SRAM memory cell array 12. Since the DRAM memory cell array 1 is divided into four blocks and the SRAM memory cell array 12 has four word lines, as shown in FIG. 5, 16 TAGs 25a to 25b are provided. It is assumed that the TAGs 25a to 25d correspond to the block B1, the TAGs 25e to 25h correspond to the block B2, the TAGs 25i to 25l correspond to the block B3, and TAGs 25m to 25p correspond to the block B4. A row address and a way address are stored in each of the TAGs 25a to 25p. In addition, in this cache system, there is provided a way logic 28 for generating a way address signal WA.

4 TAGs out of the TAGs 25a to 25p are selected in response to more significant two bits of a column address signal CA. A comparator 26 acquires a row address signal RA and compares the same with the row addresses stored in the selected four TAGs 25. The comparator 26 considers that cache hit occurs if the row address signal RA coincides with the row address stored in a single TAG, to output an activated ("H" level) cache hit signal CH and at the same time, to output a way address CWA to the way logic 28. On the other hand, the comparator 26 considers that cache miss occurs when the row address signal RA does not coincide with any of the row addresses stored in the selected four TAGs, to output an inactive ("L" level) cache hit signal CH.

The way logic 28 inputs the cache hit signal CH and the way address CWA outputted from the comparator 26. At the time of cache hit, the way logic 28 outputs the inputted way address CWA to the DRAM devices 31 as a way address signal WA without any modification. On the other hand, at the time of cache miss, the way logic 28 outputs a way address signal WA determined in accordance with a predetermined algorithm to the DRAM devices 31 and the TAGs 25a to 25p. As the above described predetermined algorithm, there are considered, for example, a simple FIFO (First-in, First-out) method and an LRU (Least recently used) method in which a least recently used way address is sent out. In this case, the way address signal WA has 2 bits.

Figure 8:
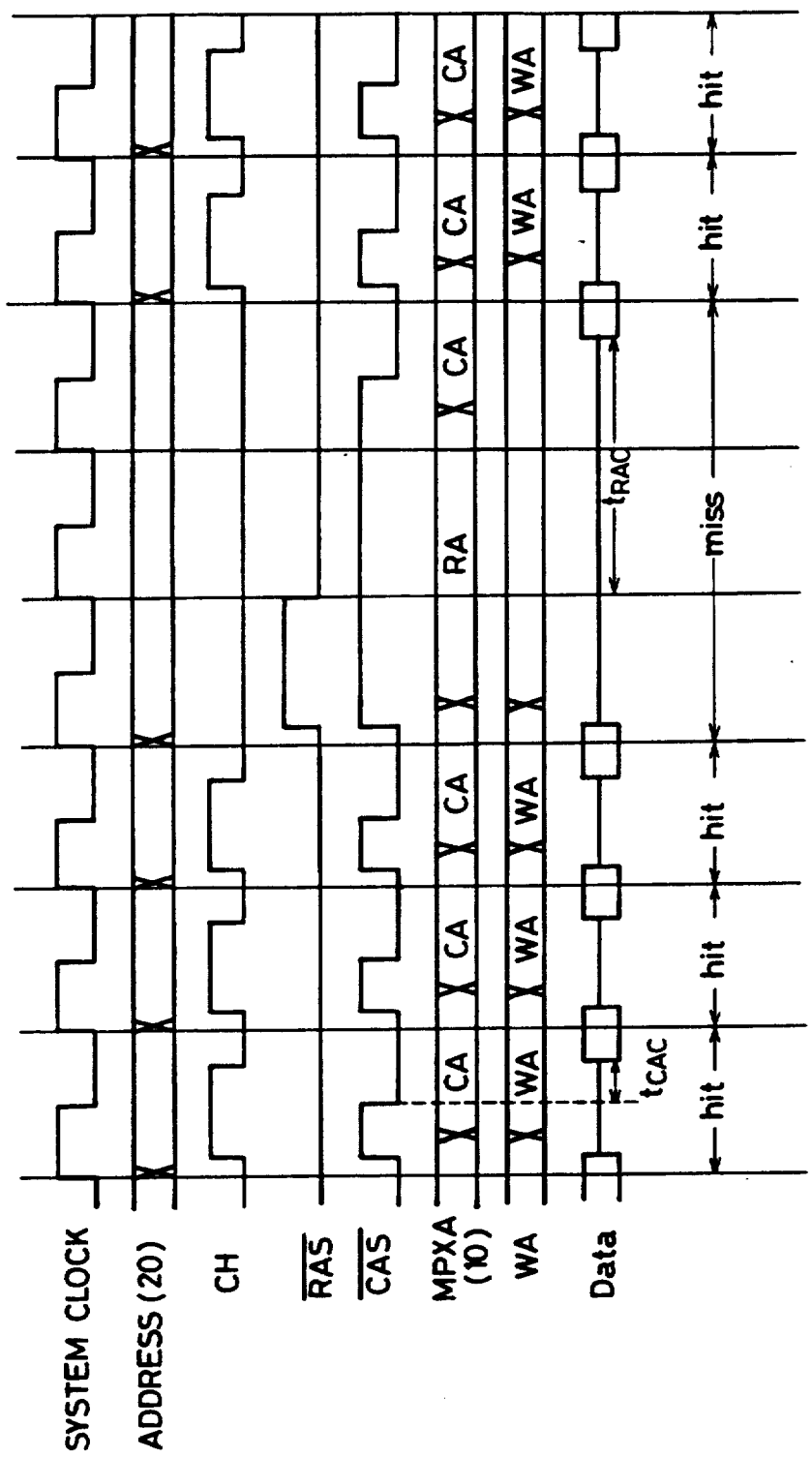
FIG. 8 is a waveform diagram showing an operation of the simple cache system shown in FIG. 7.

Referring now to a waveform diagram showing operations at the time of cache hit and cache miss shown in FIG. 8, description is made on an operation of the simple cache system shown in FIG. 7.

Row addresses RA1a to RA1p and the way address CWA accessed in the newest cycle in each of the blocks B1 to B4 are held in the TAGs 25a to TAG 25p as address sets for cache, respectively. In this case, 16 address sets are stored in the TAGs 25a to 25p. In addition, the sets of addresses frequently used may be fixedly held in the TAGs 25a to 25p. Furthermore, data in the DRAM memory cell array 1 corresponding to the row address have been already latched in the SRAM memory cells 120 in the SRAM memory cell array 12 (FIG. 6).

In such a state, an address signal corresponding to data which a CPU 24 requests is generated from an address generator 23. The comparator 26 inputs a 10-bit row address signal RA out of a 20-bit address signal. On the other hand, the four TAGs corresponding to a block selected in response to more significant two bits of a 10-bit column address signal CA out of the 20-bit address signal are made valid. It is assumed here that the TAGs 25e to 25h corresponding to the block B2 are selected.

The comparator 26 compares the inputted row address signal RA with each of the row addresses RA1e to RA1h respectively stored in the TAG 25e to 25h. When any of the row addresses RA1e to RA1h coincides with the row address signal RA, it is considered that cache hit occurred. In this case, the comparator 26 applies the activated ("H" level) cache hit signal CH to a state machine 27, the way logic 28 and each of the DRAM devices 31, and applies to the way logic 28 the way address CWA stored in the TAG 25 storing a row address which coincides with the row address signal RA. The way logic 28 receiving the "H" level cache hit signal CH outputs the inputted way address CWA to each of the DRAM devices 31 as the way address signal WA without any modification.

On this occasion, since the cache hit signal CH attains the "H" level, all the block decoders 13a to 13d are not activated. Therefore, all the transfer gates 110 are not rendered conductive, so that the SRAM memory cell array 12 and the sense amplifier portion 4 are electrically disconnected (FIGS. 5 and 6).

On the other hand, the state machine 27 performs page mode control in which a column address strobe signal $\overline{CAS}$ is toggled with a row address strobe signal $\overline{RAS}$ being kept at the "L" level. An address multiplexer 22 applies a multiplex address signal MPXA to the DRAM devices 31 as a column address signal CA. In addition, the way address signal WA inputted to each of the DRAM devices 31 is applied to the way decoder 14 through the way address buffer 15 (in FIG. 5). The way decoder 14 decodes the way address signal WA to raise a potential on a word line Wi (i: any of 1 to 14) to the "H" level. Consequently, data are read out onto the corresponding bit line pairs SBL and $\overline{SBL}$ from the SRAM memory cells 120 connected to the word line Wi (FIG. 6). In addition, the data on the bit line pair SBL and $\overline{SBL}$ selected by the corresponding column decoder 60 in response to the column address signal CA is extracted through the I/O switch 50. Thus, in the case of cache hit, output data $D_{OUT}$ is obtained from the DRAM devices 31 at high speed in an access time $T_{CAC}$ (FIG. 8).

On the other hand, when the comparator 26 determines that the row address signal RA does not coincide with any of the row addresses RA1e to RA1h, it is considered that cache miss occurred. In this case, the comparator 26 applies the "L" level cache hit signal CH to the state machine 27, the way logic 28 and each of the DRAM devices 31 (FIG. 5). The way logic 28 receiving the "L" level cache hit signal CH outputs a way address signal WA determined in accordance with a predetermined algorithm to each of the DRAM devices 31 and the TAGs 25a to 25p.

On the other hand, the state machine 27 performs control of each of the DRAM devices 31 in the ordinary cycle in which the row address strobe signal $\overline{RAS}$ is lowered and then, the column row address strobe signal $\overline{CAS}$ is lowered. The address multiplexer 22 sequentially applies to the DRAM devices 31 the row address signal RA and the column address signal CA as multiplexed.

On this occasion, since the cache hit signal CH attains the "L" level, only the block decoder 13b is activated. Consequently, the transfer gates 110 belonging to the corresponding block are rendered conductive, so that the block b in the SRAM memory cell array 12 and the sense amplifiers 40 are electrically connected (FIG. 6). On this occasion, the other blocks a, c and d in the SRAM memory cell array 12 and the sense amplifiers 40 are electrically disconnected.

Additionally, the way address signal WA is applied to the way decoder 14 through the way address buffer 15 in each of the DRAM devices 31 (FIG. 5). The way decoder 14 decodes the way address signal WA to raise the potential on the word line Wi (i: any of 1 to 4) to the "H" level. Data in the DRAM memory cell array 1 selected by the row decoder portion 3 and the column decoder portion 6 in response to the row address signal RA and the column address signal CA is read out as output data $D_{OUT}$ through the sense amplifier portion 4, the transfer gate portion 11, the SRAM memory cell array 12, the I/O switching portion 5 and the output buffer 9. At the same time, data in the SRAM memory cells 120 connected to the word line Wi in the block b in the SRAM memory cell array 12 is rewritten with data read out from the DRAM memory cell array 1.

As described in the forgoing, at the time of cache miss, output data $D_{OUT}$ is obtained from each of the DRAM devices 31 at low speed in an access time $t_{RAC}$ (in FIG. 8). Thus, the state machine 27 generates a wait signal Wait to bring the CPU 24 into a Wait state (in FIG. 7). In addition, a new row address signal RA is held in any of the TAGs 25a to 25h selected in response to more significant two bits of the column address signal CA and the way address signal WA. On this occasion, values held in the other TAGs are not changed.

Therefore, the SRAM memory cell array 12 is provided such that respective 1-bit information out of information corresponding to one row held in the sense amplifiers 40 can be stored in any of the four SRAM memory cells 120, the number of entries is 4. As a result, even when a program routine bridged over continuous two row addresses is repeatedly performed, cache hit occurs, so that a cache hit rate is improved.

Additionally, since memory control of the DRAM devices 31 at the time of cache hit and cache miss is performed every block B1 to B4, a group of data corresponding to a specified row address can be stored in the corresponding block in the SRAM memory cell array 12 independently in each of the blocks B1 to B4. Thus, the number of entries becomes $4 \times 4 = 16$, so that the cache hit rate is further improved.

Meanwhile, in the above described embodiment, for example, if a write enable signal $\overline{WE}$ is inputted to the way decoder 14, irrespective of reading and writing from and to a memory and the word lines $W_1$ to $W_4$ are set inactive ("L" level) at the time of writing ($\overline{WE}$ is at the "L" level), it is possible not to activate all the memory cells 120 in the SRAM memory cell array 12 irrespective of a level of the cache hit signal CH and a value of the way address signal WA.

Although in the above described embodiment, description was made on a case in which 1-bit information held in each of the sense amplifiers 40 is stored in any of the 4 SRAM memory cells 120, the number of SRAM memory cells 120 can be suitably increased or decreased. In addition, although in the above described embodiment, the DRAM memory cell array 1 is divided into the 4 blocks B1 to B4, the number of divisions of blocks can be suitably increased or decreased.

Additionally, although in the cache system shown in FIG. 7, description was made on an example in which, in the case of cache miss, access is made to the DRAM memory cell array 1 and at the same time, data are transferred to the cache memory comprising the SRAM memory cell array 12, this transfer can be prohibited by bringing all the word lines in the SRAM memory cell array 12 into a non-selected state. Similarly, in the case of a writing operation to the DRAM memory cell array 1, it is possible to determine whether or not data are transferred to the SRAM memory cell array 12. The example shown in FIG. 7 corresponds to 4-way set associative cache system.

As described in the foregoing, in the simple cache system using the DRAM device 31 shown in FIG. 5, data in a plurality of blocks are held in the SRAM memory cell array 12 serving as a cache memory, so that the number of entries of data to the TAGs can be increased, whereby the cache hit rate is increased.

However, in the above described simple cache system, in the case of cache hit, the way address signal WA out of address signals for making access to the SRAM memory cell array 12 serving as a cache memory is outputted after comparison in the comparator 26. Thus, the supply of the way address signal WA to the DRAM devices 31 is delayed, so that driving of word lines in the SRAM memory cell array 12 is delayed. Thus, the access time at the time of hit can not be shortened.

Figure 9:
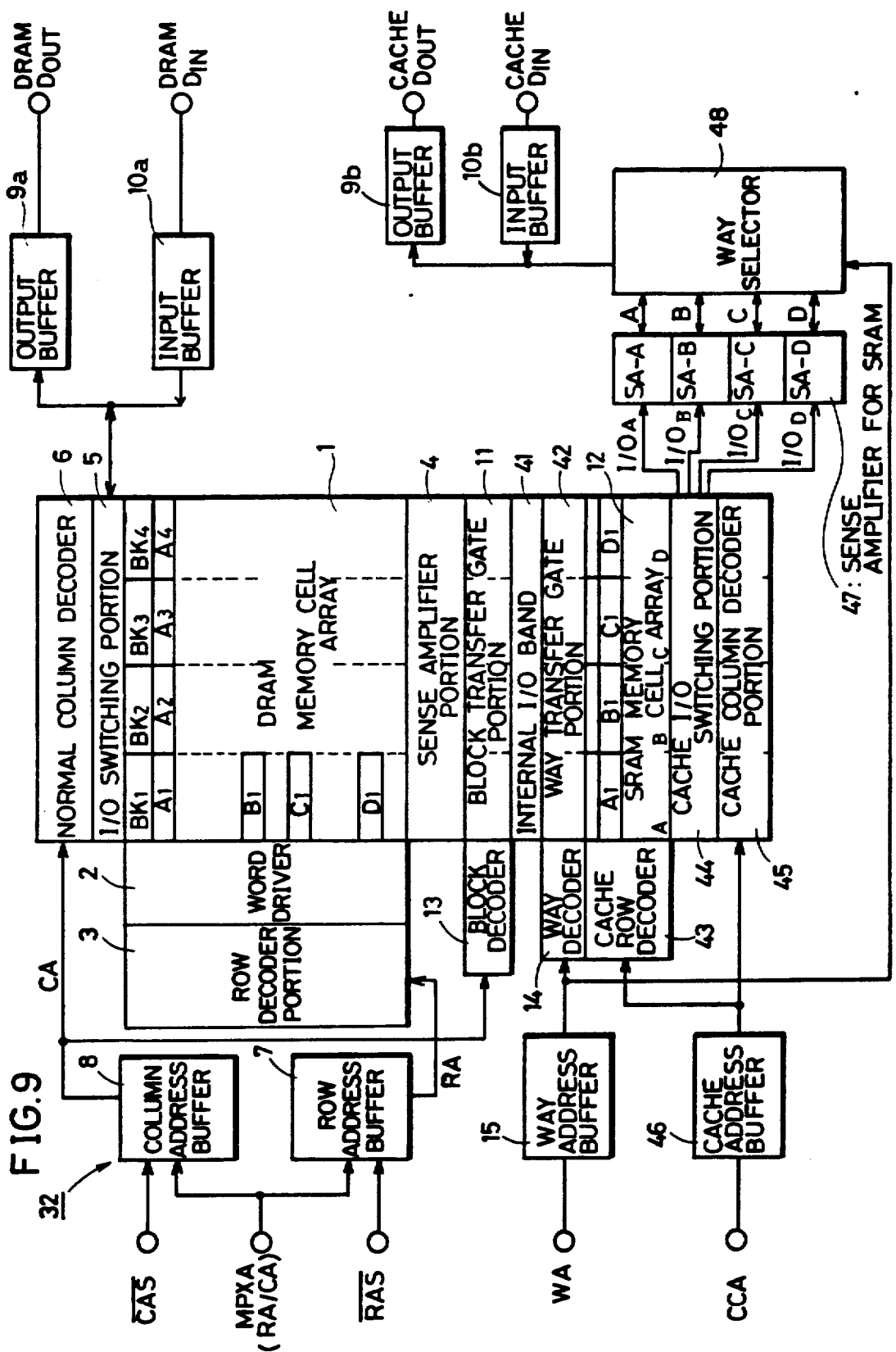
FIG. 9 is a block diagram showing a structure of a semiconductor memory device according to another embodiment of the present invention.

FIG. 9 is a block diagram showing a structure of the DRAM device according to another embodiment of the present invention. A cache system in which the access time at the time of hit can be shorten can be configured by using the DRAM device according to the present embodiment.

The DRAM device 32 in the present embodiment is the same as the DRAM device 31 according to the embodiment shown in FIG. 5 except for the following. Corresponding portions have the same reference numerals and hence, the descriptions thereof are suitably omitted. Circuit blocks shown in FIG. 9 are all formed on the same semiconductor chip.

In FIG. 9, a DRAM memory cell array 1 is divided into a plurality of blocks each comprising DRAM memory cells in a plurality of columns on the address space. In this embodiment, the DRAM memory cell array 1 is divided into 4 blocks BK1 to BK4. On the other hand, an SRAM memory cell array 12 is divided into a plurality of ways each comprising a plurality of columns. In this embodiment, the SRAM memory cell array 12 is divided into four ways A to D. The number of blocks in the DRAM memory cell array 1 and the number of ways in the SRAM memory cell array 12 may differ from each other.

A sense amplifier portion 4, a block transfer gate portion 11, an internal I/O band 41 and a way transfer gate portion 42 are arranged between the DRAM memory cell array 1 and the SRAM memory cell array 12. The block transfer gate portion 11 transfers data corresponding to one row in any of the blocks in the DRAM memory cell array to the internal I/O band 41. A block decoder 13 is responsive to a part (2 bits in this embodiment) of a column address signal CA for issuing an instruction to the block transfer gate portion 11 as to data in a block in the DRAM memory cell array 1 to be transferred. The way transfer gate portion 42 transfers the data transferred to the internal I/O band 41 to any of the ways in the SRAM memory cell array 12. The way decoder 14 is responsive to a way address signal WA applied through a way address buffer 15 for issuing an instruction to the way transfer gate portion 42 as to a way in the SRAM memory cell array 12 to which the data in the internal I/O band 41 is to be transferred.

The SRAM memory cell array 12 is provided with a cache row decoder 43, a cache I/O switching portion 44 and a cache column decoder portion 45. The cache row decoder 43 is responsive to a cache row address signal applied from a cache address buffer 46 for selecting one row in the SRAM memory cell array 12. The cache column decoder portion 45 is responsive to a cache column address signal applied from the cache address buffer 46 for selecting one column in each of the ways. The cache address buffer 46 inputs the column address signal CA applied to the DRAM memory cell array 1 as a cache address signal CCA, and applies a part thereof to the cache row decoder 43 as a cache row address signal and the other thereof to the cache column decoder 43 as a cache column address signal. A plurality of a sense amplifiers for an SRAM each corresponding to each of the ways in the SRAM memory cell array 12 are connected to the cache I/O switching portion 44 through I/O line pairs $I/O_A$ to $I/O_D$, respectively.

Data in the SRAM memory cell array 12 selected every way by the cache row decoder 43 and the cache column decoder portion 45 are detected and amplified by the corresponding SRAM sense amplifiers 47, respectively. A way selector 48 is responsive to the way address signal WA applied from the way address buffer 15 for selecting one of the data applied from the plurality of sense amplifiers 47 for an SRAM and outputting the same to the exterior through an output buffer 9b as cache output data $D_{OUT}$. Data applied to an input buffer 10b as cache input data $D_{IN}$ is written to one memory cell in the SRAM memory cell array 12 through a path opposite to that as describe above.

In FIG. 9, a state is shown in which data A1, B1, C1 and D1 corresponding to four rows in the block BK1 in the DRAM memory cell array 1 are transferred to one row in the ways A, B, C and D in the SRAM memory cell array 12.

Figure 10:
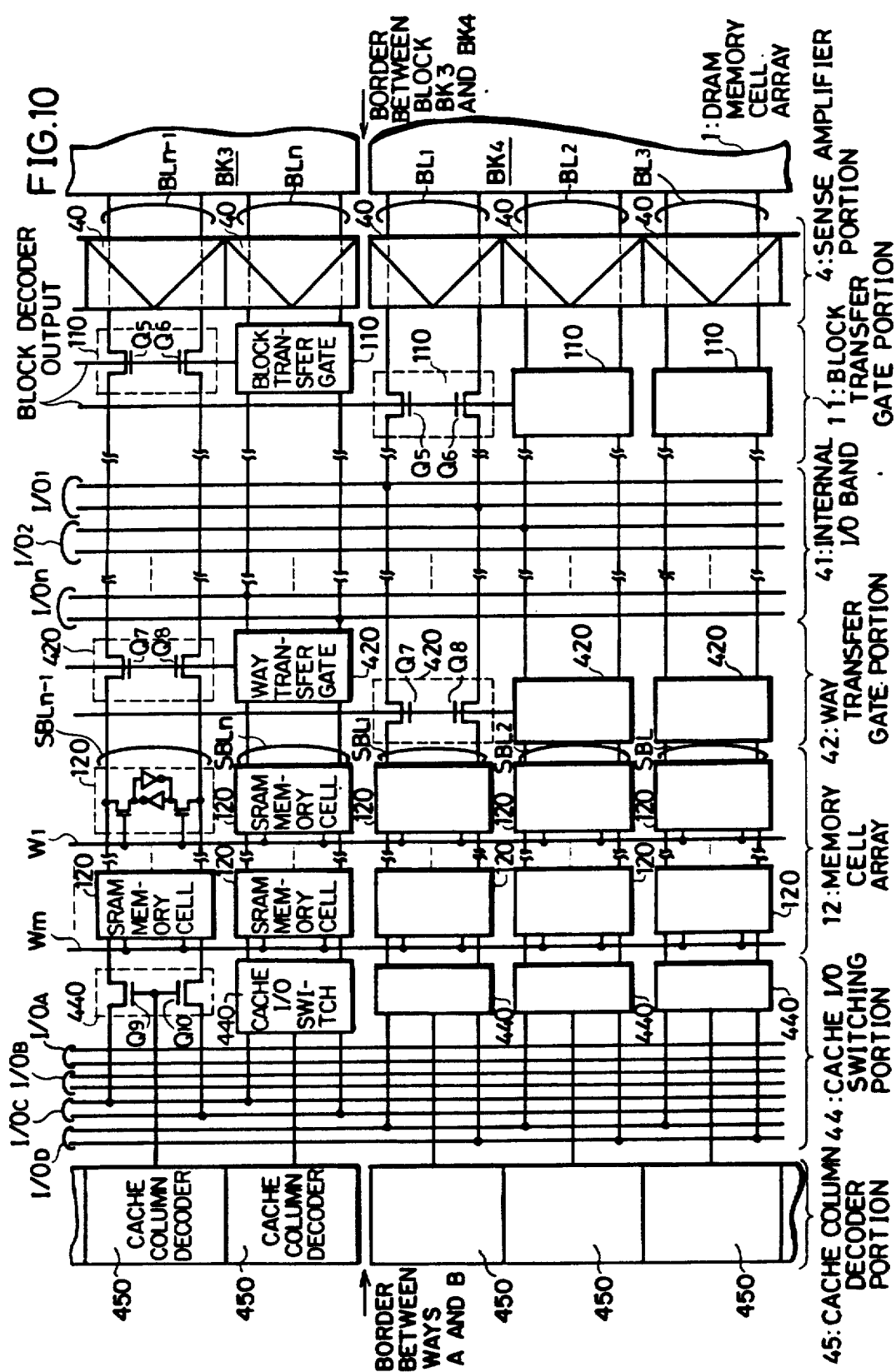
FIG. 10 is a block diagram showing specifically a structure of a part of the semiconductor memory device shown in FIG. 9.

FIG. 10 is a diagram showing specifically a part of the DRAM device shown in FIG. 9.

In each of the blocks BK1 to BK4 in the DRAM memory cell array 1, the sense amplifier portion 4 and the block transfer gate portion 11 comprise n sense amplifiers 40 and n block transfer gates 110, respectively, corresponding to n bit line pairs $BL_1$ to $BL_n$. In addition, the internal I/O band 41 comprises n I/O line pairs $I/O_1$ to $I/O_n$. The bit line pairs $BL_1$ to $BL_n$ in each of the blocks BK1 to BK4 are connected to the corresponding I/O line pairs $I/O_1$ to $I/O_n$ through the sense amplifiers 40 and the block transfer gates 110, respectively. Each of the block transfer gates 110 comprises N channel MOSFETs Q5 and Q6. The block decoder 13 (FIG. 9) applies a common block selecting signal to gates of the MOSFETs Q5 and Q6 in the block transfer gates 110 belonging to any of the blocks.

On the other hand, the SRAM memory cell array 12 is divided into four ways. In each of the ways A to D, n bit line pairs $SBL_1$ to $SBL_n$ are arranged and m (for example, four) word lines $W_1$ to $W_m$ are arranged intersecting with the n bit line pairs, SRAM memory cells 120 being provided at intersections thereof, respectively. In each of the ways A to D, the way transfer gate portion 42 comprises n way transfer gates 420, respectively, corresponding to n bit line pairs $SBL_1$ to $SBL_n$. n bit line pairs $SBL_1$ to $SBL_n$ in each of the ways A to D are connected to the corresponding I/O line pairs $I/O_1$ to $I/O_n$ in the internal I/O band 41 through the way transfer gates 420, respectively. Each of the way transfer gates 420 comprises N channel MOSFETs Q7 and Q8. The way decoder 14 (FIG. 9) applies a way selecting signal to gates of the respective MOSFETS Q7 and Q8 in the way transfer gates 420 belonging to any of the ways.

The cache I/O switching portion 44 comprises a plurality of cache I/O switches 440 corresponding to the bit line pairs $SBL_1$ to $SBL_n$ in the SRAM memory cell array 12 and four I/O line pairs $I/O_A$ to $I/O_D$ corresponding to the ways A to D. The n bit line pairs $SBL_1$ to $SBL_n$ belonging to each of the ways A to D are connected to I/O line corresponding to the way through the cache I/O switches 440, respectively. For example, the bit line pair $SBL_1$ to $SBL_n$ belonging to the way C are all connected to the I/O line pairs $I/O_C$. Each of the cache I/O switches 440 comprises N channel MOSFETs Q9 and Q10. In addition, a cache column decoder portion 45 is provided for each way. The cache column decoder portion 45 in each way comprises n cache column decoders 450 each corresponding to each column. Each of the cache column decoders 450 is connected to gates of the MOSFETs Q9 and Q10 in the corresponding cache I/O switch 440.

Figure 11:
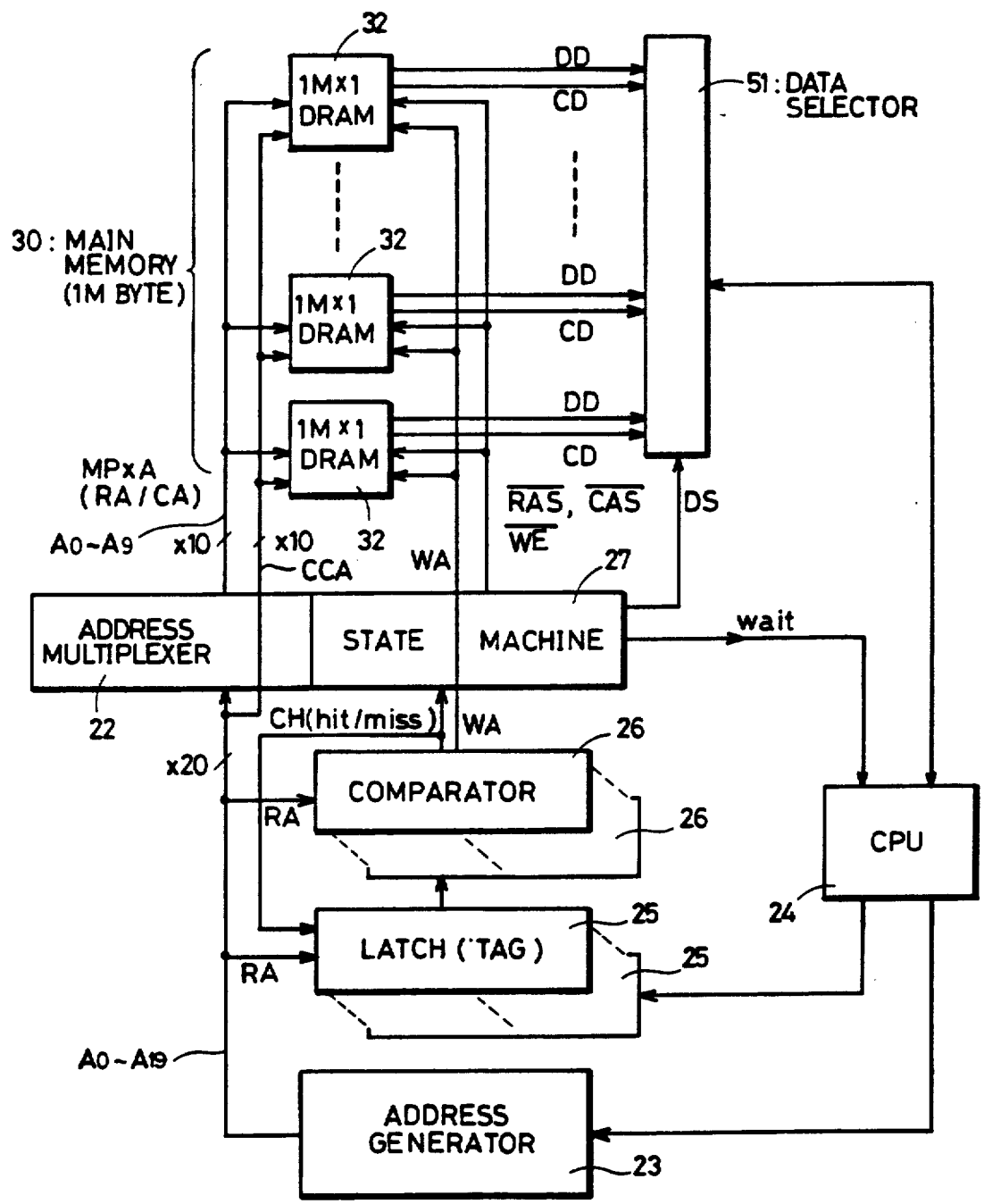
FIG. 11 is a block diagram showing a structure of a simple set associative cache system utilizing the semiconductor memory device shown in FIG. 9.

FIG. 11 is a block diagram showing a structure of a simple cache system utilizing the DRAM device shown in FIG. 9.

In FIG. 11, a main memory 30 comprises 1M byte which comprises 8 DRAM devices 32 each having 1M×1 organization. The cache system shown in FIG. 11 is the same as the cache system shown in FIG. 7 except for the following. More specifically, a 10-bit address signal corresponding to a column address signal which is not multiplexed by a multiplexer 22 is inputted to the DRAM devices 32 as a cache address signal CCA in place of a cache hit signal CH which is an output from a comparator 26. In addition a data selecting signal DS which a state machine 27 generates in response to the cache hit signal CH is inputted to a data selector 51. The data selector 51 is responsive to the data selecting signal DS for selecting DRAM data DD or cache data CD applied from the DRAM devices 32 to output the same.

Figure 12:
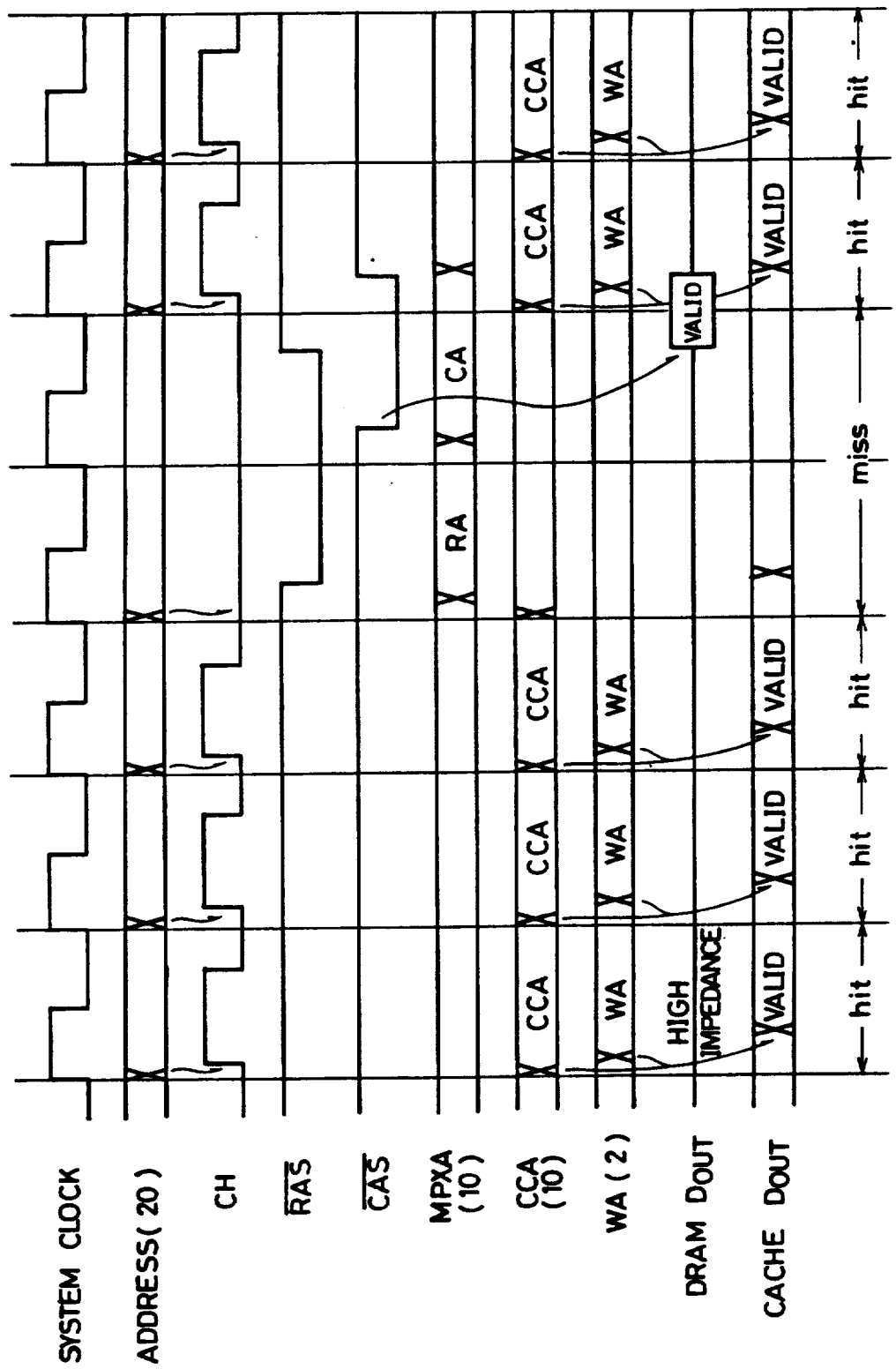
FIG. 12 is a waveform diagram showing an operation of the simple cache system shown in FIG. 11.

Referring now to a waveform diagram showing an operation shown in FIG. 12, description is made on an operation of the simple cache system shown in FIG. 11.

A plurality of row addresses and a plurality of way addresses corresponding to a row selected in the newest cycle every block are held in TAGs 25 as address sets for cache. Since it is assumed that a way address signal WA has 2 bits, four sets of row addresses are held. Thus, since the number of divisions of blocks is 4, it is considered that 16 address sets are stored in the TAGs 25. In addition, addresses frequently used may be fixedly held in the TAGs 25.

First, an address generator 23 generates an address signal corresponding to data which a CPU 24 requests. The comparator 26 compares a 10-bit row address signal RA out of a 20-bit address signal and a plurality of bits (2 bits in the example shown in FIG. 11) corresponding to the number of divisions of blocks out of a column address signal CA with the address sets held in the TAGs 25. When both coincide with each other, which means that cache hit occurs, so that the comparator 26 generates the "H" level cache hit signal CH and the way address signal WA stored in the TAG 25 in which hit occurs.

Prior to the comparison of the address signal with the address sets by the comparator 26, on the assumption that cache hit occurs, a 10-bit cache address signal CCA is inputted to the DRAM devices 32, so that a reading operation progresses in the SRAM memory cell array 12. Since it is assumed here that the SRAM memory cell array 12 is divided into 4 ways, 4-bit reading operations progress. Thus, considering a case in which cache hit occurs, when the way address signal WA is inputted, desired data is outputted through a cache output buffer 9b as cache data CD at high speed, so that data in the cache memory is obtained from the data selector 51 by a data selecting signal DS generated in response to the cache hit signal CH.

On the contrary, when the address signal inputted to the comparator 26 does not coincide with the address sets held in the TAGs 25, which means that cache miss occurs, the comparator 26 does not generate the "H" level cache hit signal CH. Consequently, the cache data CD outputted from the SRAM memory cell arrays 12 are ignored. In this case, the state machine 27 performs $\overline{RAS}$ and $\overline{CAS}$ control in the ordinary read cycle, and the address multiplexer 22 sequentially supplies the row address signal RA and the column address signal CA to the DRAM devices 32 (see FIG. 12). Thus, in the case of such cache miss, output data is obtained at low speed in an access time $t_{RAC}$, so that the state machine 27 generates a wait signal Wait, to bring the CPU24 into a Wait state. In the case of cache miss, in FIG. 10, data in a block including a memory cell accessed at that time are transferred to the I/O line pairs $I/O_1$ to $I/O_n$ in the internal I/O band 41 through block transfer gates 110 which are rendered conductive by the block decoder 13. The data are transferred to a suitable way in the SRAM memory cell array 12 through the way transfer gates 420 selected by the way address signal WA, so that the contents stored in the SRAM memory cells 120 on a row selected by the cache row decoder 42 are rewritten. In addition, a new address set accessed at this time is held in the TAG 25 concerning the way.

As described in the foregoing, according to the above described embodiment, data corresponding to a plurality of blocks are held in the SRAM memory cell array 120 serving as a cache memory, the number of entries of data to the TAGs 25 can be increased, so that the probability of hit can be improved and an access time of the cache memory is shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device containing a cache memory, comprising, on a single chip:
   a first memory cell array comprising a plurality of word lines, a plurality of bit line pairs perpendicular to said plurality of word lines and a plurality of memory cells arranged in a matrix of a plurality of rows corresponding to said word lines and columns corresponding to said bit line pairs, said first memory cell array being divided into a plurality of blocks each comprising a plurality of columns,
   a cache memory including a second memory cell array comprising a plurality of static type memory cells arranged in a plurality of rows and a plurality of columns corresponding to said plurality of columns in said first memory cell array, said second memory cell array being divided into a plurality of blocks each comprising a plurality of columns, each said static type memory cell being aligned with and connected to one of said plurality of bit line pairs,
   first access means responsive to a cache miss indicating signal for accessing data at a memory cell of said first memory cell array selected by a first row address signal and a column address signal, said first access means comprising block selecting means responsive to a block selecting signal for selecting any of said plurality of blocks in said first memory cell array,
   second access means responsive to a cache hit indicating signal for accessing data at a static type memory cell selected by a second row address signal and a column address signal, and
   data transfer means for transferring data between a column in said first memory cell array and a respective column in said second memory cell array.

2. The semiconductor memory device according to claim 1, which further comprises:
   switching means responsive to said cache miss indicating signal for activating said data transfer means.

3. The semiconductor memory device according to claim 1, wherein
   said block selecting signal comprises a part of a column address signal.

4. The semiconductor memory device according to claim 1, wherein
   said first access means comprises
      first row selecting means responsive to said first row address signal for selecting any of said plurality of rows in said first memory cell array, and
      column selecting means responsive to said column address signal for selecting any of said plurality of columns in said first memory cell array, and
   said second access means comprises
      second row selecting means responsive to said second row address signal for selecting any of plurality of rows in said second cache memory cell array.

5. The semiconductor memory device according to claim 4, which further comprises:
   data input/output means for inputting/outputting data to/from a memory cell selected by said first row selecting means and said column selecting means or a static type memory cell selected by said second row selecting means and said column selecting means.

6. The semiconductor memory device according to claim 4, which further comprises:
   a plurality of sense amplifiers for detecting and holding data on the row selected by said first row selecting means.

7. The semiconductor memory device according to claim 4, wherein
   said second row selecting means further comprises means for inactivating all the static type memory cells included in said second cache memory cell array.

8. The semiconductor memory device according to claim 1, wherein
   each of said plurality of memory cells included in said first memory cell array comprises a dynamic type memory cell.

9. A semiconductor memory device containing a cache memory as recited in claim 1, wherein said first access means is responsive to a row activating signal, said row activating signal being in an activated state during occurrence of said cache hit indicating signal.

10. The semiconductor device according to claim 1, wherein each of said blocks have a predetermined equal number of bit line pairs and each of said blocks of said cache memory include said predetermined equal number of columns.

11. The semiconductor device according to claim 10, wherein said first and second memory cell arrays are divided into equal numbers of blocks.

12. A semiconductor memory device containing a cache memory, comprising, on a single chip:
   a dynamic random access memory comprising a plurality of word lines, a plurality of bit line pairs arranged so as to intersect with said plurality of word lines and a plurality of memory cells at intersections of said plurality of word lines and said plurality of bit line pairs, and a cache memory comprising a plurality of stages of storage means groups, each storage means group having a plurality of storage means, each storage means being physically aligned with and connected to one of said plurality of bit line pairs.

13. A semiconductor memory device containing a cache memory, comprising, on a single chip:
- a dynamic random access memory comprising a plurality of word lines, a plurality of bit line pairs arranged so as to intersect with said plurality of word lines and a plurality of memory cells at intersection of said plurality of word lines and said plurality of bit line pairs,
- a cache memory comprising a plurality of storage means arranged in rows and columns, each of said cache memory storage means being physically aligned with a respective bit line pair, and
- a plurality of transfer gates, one transfer gate for each column of said storage means of cache memory and connectable to one of said bit line pairs of dynamic random access memory.

14. A semiconductor memory device containing a cache memory, comprising, on a single chip:
- a first memory cell array comprising a plurality of word lines, a plurality of bit line pairs perpendicular to said plurality of word lines and a plurality of memory cells arranged in a matrix of a plurality of rows corresponding to said word lines and columns corresponding to said bit line pairs, said first memory cell array being divided into a plurality of blocks each comprising a plurality of columns,
- a cache memory including a second memory cell array comprising a plurality of blocks, each block having a plurality of static type memory cells arranged in one or more rows and a plurality of columns corresponding to said plurality of columns included in each of said blocks of said first memory cell array, each said static type memory cells being aligned with one of said bit line pairs,
- first access means responsive to a cache miss indicating signal for accessing data at a memory cell of said first memory cell array selected by a first row address signal and a column address signal, said first access means comprising block selecting means responsive to a block selecting signal for selecting any of said plurality of blocks in said first memory cell array,
- second access means responsive to a cache hit indicating signal for accessing data at a static type memory cell selected by a second row address signal and a column address signal, and
- data transfer means for transferring data from memory cells in a row of block of said first memory cell array selected by said block selecting means to memory cells in a row of a selected block of said second memory cell array.

15. The semiconductor memory device according to claim 14, wherein each memory cell of said first memory cell array is a dynamic type memory cell.

16. The semiconductor memory device according to claim 14, wherein said static type memory cells of said blocks of said second memory cell array are arranged in at least two rows.

17. A semiconductor memory device containing a cache memory, comprising, on a single chip:
- a dynamic random access memory comprising a plurality of bit lines, a plurality of first blocks each having a plurality of dynamic type memory cells arranged in a matrix of a plurality of rows and a plurality of columns corresponding to said bit lines, a number of columns in each first block being equal,
- a cache memory comprising a plurality of second blocks each having a plurality of static type memory cells arranged in one or more rows and a plurality of columns, a number of columns in each of said second blocks being equal to the number of columns in said first blocks, each of said static type memory cells being aligned with one of said bit lines, and
- data transfer means for transferring data from dynamic type memory cells in a row of one of said first blocks of said dynamic random access memory to static type memory cells in a row of one of said second blocks of said cache memory.

18. The semiconductor memory device according to claim 17, wherein said static type memory cells of said second blocks are arranged in at least two rows.

19. A semiconductor memory device containing a cache memory, comprising, on a single chip:
- a first memory cell array comprising a plurality of word lines, a plurality of bit line pairs of perpendicular to said plurality of word lines and a plurality of memory cells arranged in a matrix of a plurality of rows corresponding to said word lines and columns corresponding to said bit line pairs
- a cache memory including a second memory cell array comprising a plurality of static type memory cells arranged in a plurality of rows and a plurality of columns corresponding to said plurality of columns in said first memory cell array each said static type memory cell being aligned with and connected to one of said plurality of bit line pairs,
- first access means responsive to a cache miss indicating signal for accessing data at a memory cell of said first memory cell array selected by a first row address signal and a column address signal,
- second access means responsive to a cache hit indicating signal for accessing data at a static type memory cell selected by a second row address signal and a column address signal, and
- data transfer means for transferring data between a column in said first memory cell array and a respective column in said second memory cell array.

* * * * *